United States Patent
Kamata et al.

(10) Patent No.: US 9,634,500 B2
(45) Date of Patent: Apr. 25, 2017

(54) STORAGE BATTERY SYSTEM

(71) Applicant: KEIHIN CORPORATION, Tokyo (JP)

(72) Inventors: Seiji Kamata, Utsunomiya (JP); Satomu Sasaki, Sakura (JP)

(73) Assignee: KEIHIN CORPORATION, Tokyo (JP)

( * ) Notice: Subject to any disclaimer, the term of this patent is extended or adjusted under 35 U.S.C. 154(b) by 398 days.

(21) Appl. No.: 14/159,142

(22) Filed: Jan. 20, 2014

(65) Prior Publication Data
US 2014/0210414 A1 Jul. 31, 2014

(30) Foreign Application Priority Data

Jan. 25, 2013 (JP) ................................. 2013-012451
Jan. 25, 2013 (JP) ................................. 2013-012454

(51) Int. Cl.
*H02J 7/00* (2006.01)
*G01R 31/36* (2006.01)
(Continued)

(52) U.S. Cl.
CPC ........ *H02J 7/0021* (2013.01); *G01R 31/3658* (2013.01); *G01R 35/00* (2013.01);
(Continued)

(58) Field of Classification Search
CPC ................................................... H02J 7/0021
(Continued)

(56) References Cited

U.S. PATENT DOCUMENTS

2010/0004885 A1  1/2010  Nakanishi
2013/0179007 A1*  7/2013  Dalum ............... B60W 20/108
                                                    701/2

FOREIGN PATENT DOCUMENTS

CN    101051763 A    10/2007
CN    101622547 A    1/2010
(Continued)

OTHER PUBLICATIONS

Japanese Notice of Allowance corresponding to Application Number: 2013-012451; Date of Mailing: Jun. 28, 2016, with English translation.
(Continued)

*Primary Examiner* — Thuan Do
(74) *Attorney, Agent, or Firm* — Cantor Colburn LLP

(57) ABSTRACT

The storage battery system includes a storage battery comprising a plurality of battery modules; a plurality of voltage monitoring circuits for monitoring a voltage of the battery module; and a control device that controls charging and discharging of the storage battery on the basis of monitoring information that is obtained by carrying out communication with the voltage monitoring circuits, wherein the control device comprises a determination unit that calculates an estimated output voltage of the storage battery by using the monitoring information that is obtained from any one of the voltage monitoring circuits before occurrence of a communication failure in a case where the communication failure with any one of the voltage monitoring circuits occurs, and compares the estimated output voltage and an output voltage of the storage battery after occurrence of the communication failure to determine an abnormal site of the communication failure.

9 Claims, 6 Drawing Sheets

(51) Int. Cl.
*G01R 35/00* (2006.01)
*H01M 2/34* (2006.01)
*H01M 10/44* (2006.01)
*H01M 10/48* (2006.01)

(52) U.S. Cl.
CPC ........... *H01M 2/34* (2013.01); *H01M 10/441* (2013.01); *H01M 10/48* (2013.01); *H01M 10/482* (2013.01); *G01R 31/362* (2013.01); *H01M 2200/00* (2013.01); *H01M 2220/20* (2013.01); *Y02T 10/7055* (2013.01)

(58) Field of Classification Search
USPC .......................................................... 320/118
See application file for complete search history.

(56) References Cited

FOREIGN PATENT DOCUMENTS

| | | |
|---|---|---|
| CN | 102033205 A | 4/2011 |
| CN | 102656048 A | 9/2012 |
| JP | 2003134675 A | 5/2003 |
| JP | 2005261193 A | 9/2005 |
| JP | 2008-220074 A | 9/2008 |
| JP | 2010151756 A | 7/2010 |
| JP | 2011027608 A | 2/2011 |
| JP | 2011232171 A | 11/2011 |
| JP | 2012198170 A | 10/2012 |
| WO | 2011111350 A1 | 9/2011 |
| WO | 2012114479 A1 | 8/2012 |

OTHER PUBLICATIONS

Japanese Notice of Allowance corresponding to Application Number: 2013-012454; Date of Mailing: Jun. 28, 2016, with English translation.

Chinese Office Action corresponding to Application No. 201410028173.4; Date of Mailing: Sep. 2, 2016, with English translation of the search report.

* cited by examiner

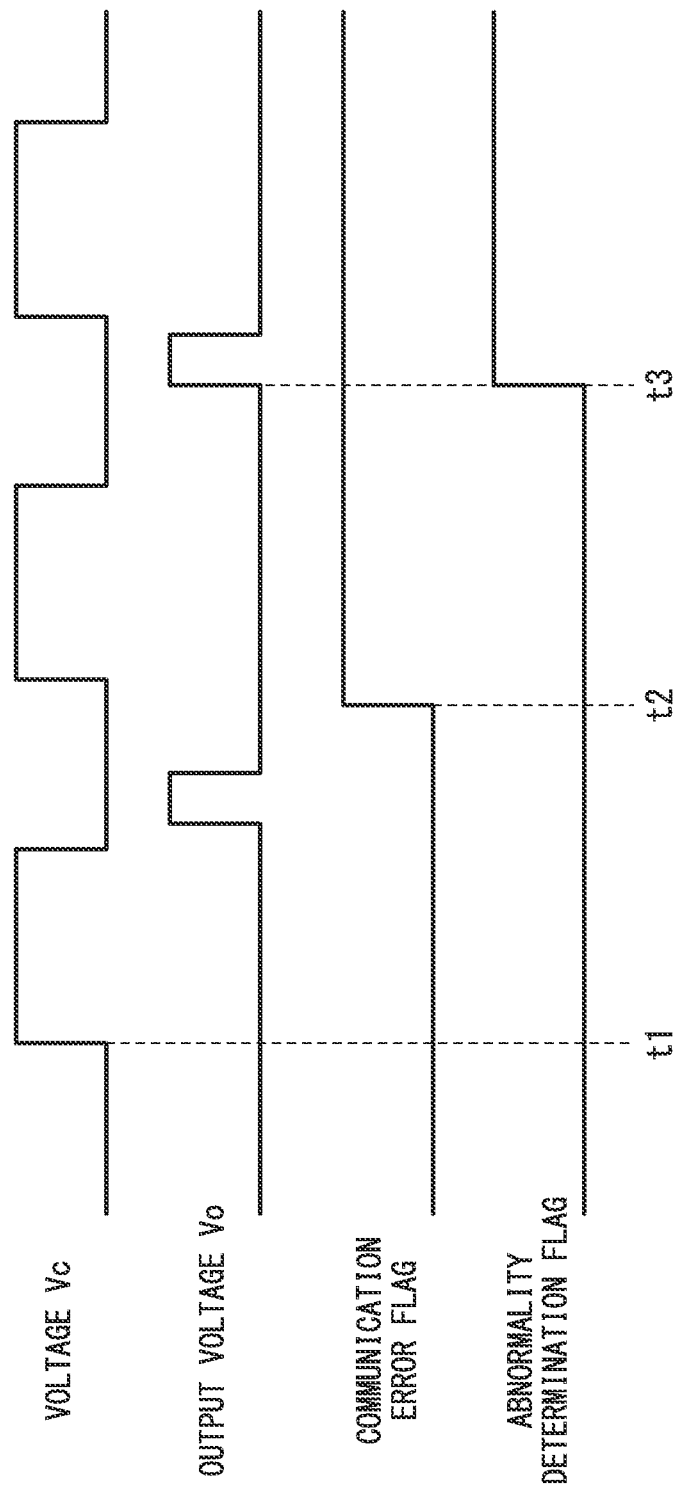

STORAGE BATTERY SYSTEM

CROSS-REFERENCE TO RELATED APPLICATION

Priority is claimed on Japanese Patent Application No. 2013-012451 filed on Jan. 25, 2013 and Japanese Patent Application No. 2013-012454 filed on Jan. 25, 2013, the contents of which are incorporated herein by reference.

BACKGROUND OF THE INVENTION

Field of the Invention

The present invention relates to a storage battery system.

Description of Related Art

The storage battery system includes a storage battery (secondary battery) and a control device. The storage battery (secondary battery) is capable of recharging a lithium ion battery and the like. The control device controls charging and discharging of the storage battery. The storage battery system is a system that carries out taking out of electric power stored in the storage battery and storage of the electric power in the storage battery (charging and discharging) under control of the control device. The storage battery system is used, for example, as a power supply that is mounted on an electric vehicle (EV) and a hybrid vehicle (HV).

Most storage batteries provided in the storage battery system have a configuration in which battery modules are connected in series to obtain a necessary voltage. Each of the battery modules is configured by connecting a plurality of battery cells (unit batteries) in series. The storage battery system including the storage battery includes a voltage monitoring circuit for each battery module that constitutes the storage battery. The control device carries out control of taking out of the electric power stored in the storage battery and storage of electric power in the storage battery (charging and discharging control) while referring monitoring information (monitoring data) of each voltage monitoring circuit.

Japanese Unexamined Patent Application, First Publication No. 2008-220074 discloses a conventional example of the storage battery system. Specifically, Japanese Unexamined Patent Application, First Publication No. 2008-220074 discloses a storage battery system in which a plurality of subordinate controllers (cell controllers) and a host controller (battery controller) that controls the plurality of subordinate controllers are connected in a chained (daisy chain) serial communication. The plurality of subordinate controllers (cell controllers) is provided in each of the battery modules and carries out control of battery cells that constitute the corresponding battery module.

SUMMARY OF THE INVENTION

Each of the subordinate controllers, which are provided in the storage battery system disclosed in Japanese Unexamined Patent Application, First Publication No. 2008-220074, operates by receiving power from a corresponding battery module and carries out control of the battery cells and the serial communication. Accordingly, in a case where abnormality occurs in the storage battery, a failure occurs in the serial communication between the host controller and the subordinate controllers due to stoppage of the supply of power from the battery module to the subordinate controller and the like. In addition, for example, the abnormality of the storage battery occurs due to shut-off (opening) of a storage battery current path such as due to a breaker, a fuse, a current interrupt device (CID: overcurrent shut-off device), and a power supply line which are provided inside the storage battery.

In addition, in a case where the supply of power from the battery module to the subordinate controller is carried out as normal, but abnormality occurs in the subordinate controller, operation of the subordinate controller in which abnormality occurs is stopped (or, does not operate as normal). Therefore, similar to a case in which abnormality occurs in the above-described storage battery, a failure occurs in the serial communication between the host controller and the subordinate controller.

As described above, as a main cause of the occurrence of a failure in the serial communication between the host controller and the subordinate controller, abnormality in the storage battery and abnormality in the subordinate controller may be exemplified. However, in the storage battery system in the related art, in a case where a failure occurs in the serial communication with the subordinate controller, there is a problem in that it is difficult for the host controller to determine which side the cause of the failure belongs to.

Aspects relating to the present invention have been made in consideration of the above-described situations, and an object thereof is to provide a storage battery system that is capable of easily determining the cause of a failure when a communication failure occurs.

The aspects relating to the invention employ the following configurations to solve the above-described problems.

(1) An aspect of the storage battery system according to the invention includes: a storage battery including a plurality of battery modules, each of the plurality of battery modules being configured by connecting battery cells in series; a plurality of voltage monitoring circuits for monitoring a voltage of the battery module, each of the plurality of voltage monitoring circuits being provided in accordance with each of the battery modules; and a control device that is connected to the voltage monitoring circuits in a circular shape, and controls charging and discharging of the storage battery on the basis of monitoring information that is obtained by carrying out communication with the voltage monitoring circuits, wherein the control device includes a determination unit that calculates an estimated output voltage of the storage battery by using the monitoring information that is obtained from any one of the voltage monitoring circuits before occurrence of a communication failure in a case where the communication failure with any one of the voltage monitoring circuits occurs and compares the estimated output voltage and an output voltage of the storage battery after occurrence of the communication failure to determine an abnormal site of the communication failure.

(2) In the aspect (1), in a case where the estimated output voltage is more than the output voltage of the storage battery after occurrence of the communication failure, the determination unit may determine that the storage battery is the abnormal site.

(3) In the aspect (1) or (2), in a case where the estimated output voltage is equal to or less than the output voltage of the storage battery after occurrence of the communication failure, the determination unit may determine that the voltage monitoring circuit is the abnormal site.

(4) In the aspects (1) to (3), the determination unit may calculate the estimated output voltage by multiplying the monitoring information obtained from any one of the voltage monitoring circuits by a value obtained by dividing a total number of the battery cells provided in the storage battery by a number of the battery cells provided in the battery module.

(5) In the aspects (1) to (4), the monitoring information that is used for calculation of the estimated output voltage may be monitoring information having the largest voltage value among monitoring information obtained from the voltage monitoring circuits before occurrence of the communication failure.

(6) Another aspect of storage battery system according to the invention includes: a storage battery including a plurality of battery modules, each of the plurality of battery modules being configured by connecting battery cells in series; a plurality of voltage monitoring circuits for individually monitoring a voltage of the battery cells that constitute the battery module, each of the plurality of voltage monitoring circuits being provided in accordance with each of the battery modules; and a control device that is connected to the voltage monitoring circuits in a circular shape, and controls charging and discharging of the storage battery on the basis of monitoring information that is obtained by carrying out communication with the voltage monitoring circuits, wherein the control device includes a determination unit that calculates an estimated output voltage of the storage battery by using any one of monitoring information of the battery cells which are obtained from the voltage monitoring circuits before occurrence of a communication failure in a case where the communication failure with any one of the voltage monitoring circuits occurs and compares the estimated output voltage and an output voltage of the storage battery after occurrence of the communication failure to determine an abnormal site of the communication failure.

(7) In the aspect (6), in a case where the estimated output voltage is more than the output voltage of the storage battery after occurrence of the communication failure, the determination unit may determine that the storage battery is the abnormal site.

(8) In the aspect (6) or (7), in a case where the estimated output voltage is equal to or less than the output voltage of the storage battery after occurrence of the communication failure, the determination unit may determine that the voltage monitoring circuit is the abnormal site.

(9) In the aspects (6) to (8), the determination unit may calculate the estimated output voltage by multiplying any one of monitoring information of the battery cells which are obtained from the voltage monitoring circuits by a total number of the battery cells that are provided in the storage battery.

(10) In the aspects (6) to (9), the monitoring information that is used for calculation of the estimated output voltage may be monitoring information having the largest voltage value among the monitoring information of the battery cells which are obtained from the voltage monitoring circuits before occurrence of the communication failure.

(11) In the aspects (6) to (10), the storage battery may include a plurality of overcurrent shut-off devices, each being provided to each of the battery cells.

According to an aspect of the invention, in a case where communication failure with any one of the voltage monitoring circuits occurs, the determination unit that is provided to the control device calculates the estimated output voltage of the storage battery by using the monitoring information that is obtained from any one of the voltage monitoring circuits before occurrence of the communication failure and compares the estimated output voltage and an output voltage of the storage battery after occurrence of the communication failure to determine an abnormal site of the communication failure. Accordingly, it is possible to easily determine a cause of the communication failure.

According to another aspect of the invention, in a case where communication failure with any one of the voltage monitoring circuits occurs, the determination unit that is provided to the control device calculates the estimated output voltage of the storage battery by using any one of monitoring information of the battery cells which are obtained from the voltage monitoring circuits before occurrence of the communication failure and compares the estimated output voltage and the output voltage of the storage battery after occurrence of the communication failure to determine an abnormal site of the communication failure. Accordingly, it is possible to easily determine a cause of the communication failure.

BRIEF DESCRIPTION OF THE DRAWINGS

FIG. 6 is a timing chart illustrating the operation of the storage battery system according to the second embodiment of the invention.

DETAILED DESCRIPTION OF THE INVENTION

First Embodiment

Hereinafter, a storage battery system according to a first embodiment of the invention will be described in detail with reference to the attached drawings. In addition, for easy comprehension, a storage battery system that is mounted on a vehicle such as an electric vehicle (EV) and a hybrid vehicle (HV) will be described as an example.

Figure 1:
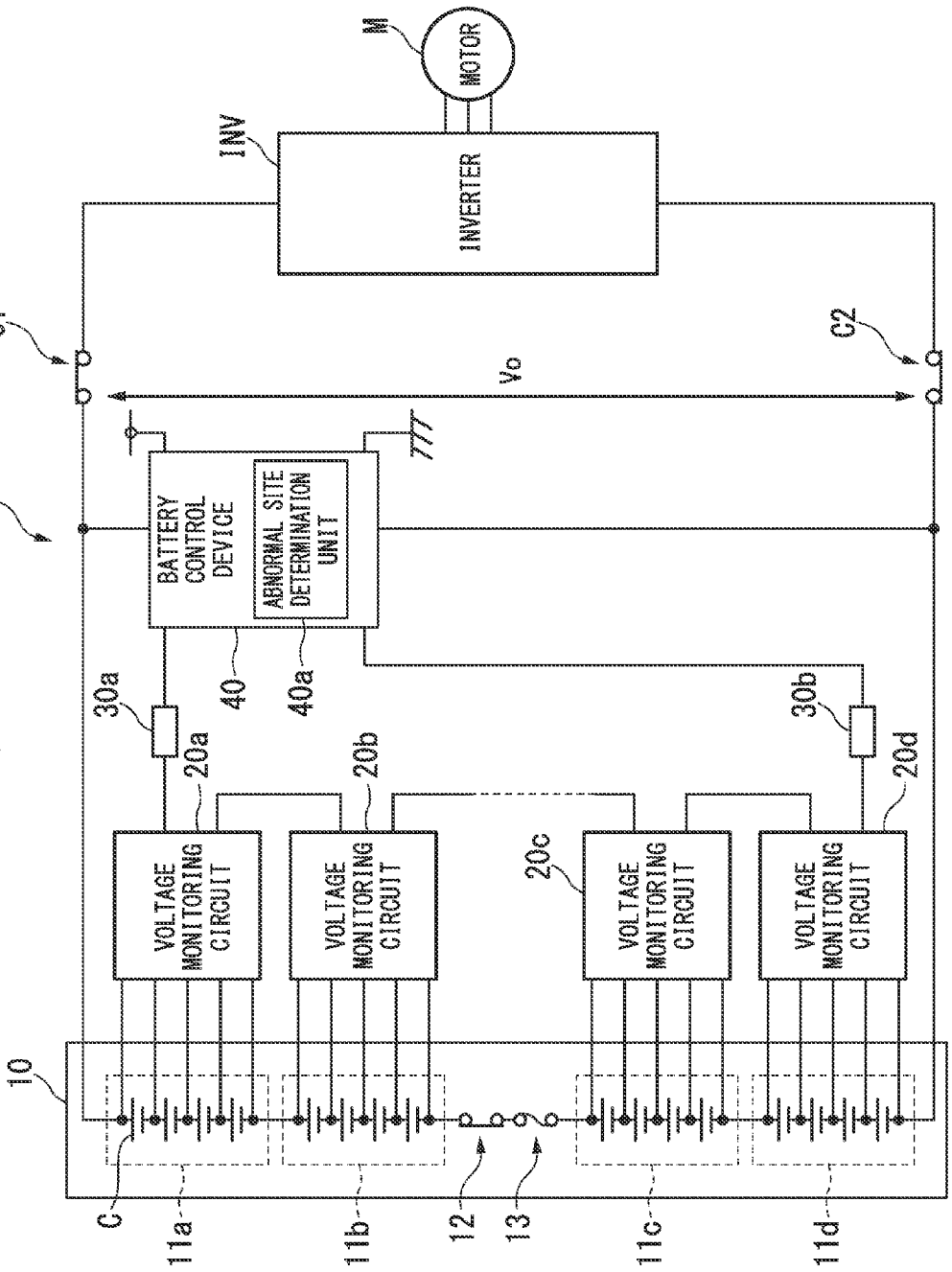
FIG. 1 is a block diagram illustrating a configuration of a main section of a storage battery system according to a first embodiment of the invention.

FIG. 1 shows a block diagram illustrating a configuration of a main section of the storage battery system according to the first embodiment of the invention. As shown in FIG. 1, the storage battery system 1 according to the embodiment includes a storage battery 10, voltage monitoring circuits 20a to 20d, insulating elements 30a and 30b, and a battery control device 40 (control device).

The storage battery system 1 is connected to an inverter INV through contactors C1 and C2. The storage battery system 1 discharges electric power that is stored in the storage battery 10 to supply the electric power to the inverter INV and charges the storage battery 10 using regenerated electric power supplied from the inverter INV.

Here, the contactors C1 and C2 are a kind of mechanical switches and allow between the storage battery 10 and the inverter INV to enter an opened state and a closed state. The contactor C1 is provided between the storage battery 10 and a positive electrode terminal of the inverter INV. The contactor C2 is provided between the storage battery 10 and a negative electrode terminal of the inverter INV. The inverter INV drives a motor M using electric power supplied from the storage battery system 1 and generates power for allowing a vehicle to travel. In addition, the inverter INV allows the motor M to serve as a generator during deceleration and supplies electric power generated by the motor M to the storage battery system 1 as regenerated electric power during deceleration of the vehicle.

The storage battery 10 includes battery modules 11a to 11d that are connected in series, a breaker 12, and a fuse 13. The storage battery 10 carries out discharging of electric power that is stored and charging of electric power that is supplied, under control of the battery control device 40. The battery modules 11a to 11d are modules that are configured by connecting a plurality of battery cells C, which are specified in advance, in series. Here, each of the battery cells C is a unit battery that is provided in the battery modules 11a to 11d. For example, the battery cell C is a storage battery (secondary battery) such as a lithium ion battery that is capable of carrying out recharging. In addition, in FIG. 1, the storage battery 10 including four battery modules 11a to 11d is shown in order to simplify the description. However, the number of battery modules that are provided in the storage battery 10 is arbitrary.

The breaker 12 and the fuse 13 are connected in series between the battery module 11b and the battery module 11c and are provided to shut off (open) a current path of the storage battery 10. For example, the breaker 12 is provided in order for an operator to manually shut off the current path of the storage battery 10. In addition, the fuse 13 is used to automatically shut off the current path of the storage battery 10 in a case where an overcurrent flows to the storage battery 10. In addition, it is not necessary for the positions of the breaker 12 and the fuse 13 to be located between the battery modules 11b and 11c. For example, the positions may be located between the battery modules 11a and 11b or between the battery modules 11c and 11d.

The voltage monitoring circuits 20a to 20d are provided in the battery modules 11a to 11d of the storage battery 10, respectively. The voltage monitoring circuits 20a to 20d monitor voltages of corresponding battery modules (voltages of the entirety of corresponding battery modules), and voltages of the battery cells C provided in corresponding battery modules. The voltage monitoring circuits 20a to 20d operate by receiving power from corresponding battery modules 11a to 11d, respectively.

In addition, the voltage monitoring circuits 20a to 20d are cascade-connected (daisy-chain-connected) to each other and are connected to the battery control device 40 through the insulating elements 30a and 30b. The battery control device 40 is connected to the voltage monitoring circuits 20a to 20d in a circular shape. The voltage monitoring circuits 20a to 20d carry out communication with the battery control device 40 and transmit monitoring information (monitoring data) of each of the battery modules and the battery cells C to the battery control device 40. In addition, in FIG. 1, four voltage monitoring circuits 20a to 20d are shown for brief description. However, the provided number of the voltage monitoring circuits is the same as the number of the battery modules of the storage battery 10.

The insulating elements 30a and 30b are elements that electrically insulate between the voltage monitoring circuits 20a to 20d that are daisy-chain-connected and the battery control device 40 and are realized, for example, by a photo-coupler. In addition, the insulating element 30a is provided between the battery control device 40 and the voltage monitoring circuit 20a, and the insulating element 30b is provided between the battery control device 40 and the voltage monitoring circuit 20d.

The battery control device 40 controls charging and discharging of the storage battery 10 on the basis of the monitoring information of the voltage monitoring circuits 20a to 20d. Specifically, the battery control device 40 obtains residual capacity (State Of Charge: SOC) of the storage battery 10 from the monitoring information of the voltage monitoring circuits 20a to 20d. In a case where the residual capacity of the storage battery 10 which is obtained by the battery control device 40 is in a permissible range that is specified in advance, the charging and discharging of the storage battery 10 is controlled in accordance with a travelling state of a vehicle. For example, in a case of generating power for allowing the vehicle to travel by driving the motor M, control for discharging electric power stored in the storage battery 10 is carried out. In addition, for example, in a case of decelerating the vehicle, control for charging the storage battery 10 using regenerated electric power supplied from the inverter NV is carried out.

In addition, the battery control device 40 includes an abnormal site determination unit 40a (determination unit) that determines a site (abnormal site) that is a cause of a communication failure in a case where the communication failure with the voltage monitoring circuits 20a to 20d occurs. In addition, the abnormal site determination unit 40a may be realized by a hardware circuit or may be realized by cooperation between software and hardware resources by allowing a computer to read out software that realizes the abnormal site determination unit 40a.

In a case where the communication failure with the voltage monitoring circuits 20a to 20d occurs, the abnormal site determination unit 40a calculates an estimated output voltage Vp which is estimated as an output voltage of the storage battery 10 by using the monitoring information (a voltage of any one of the battery modules 11a to 11d) that is obtained from any one of the voltage monitoring circuits 20a to 20d before (immediately before) occurrence of the communication failure. In addition, the abnormal site determination unit 40a compares the estimated output voltage Vp that is calculated and an output voltage Vo of the storage battery 10 which is measured by a voltage measurement unit (not shown) provided to the battery control device 40 to determine an abnormal site.

Specifically, in a case where the estimated output voltage Vp is more than the output voltage Vo of the storage battery 10, the abnormal site determination unit 40a determines that the storage battery 10 is the abnormal site. This is because in a case where a cause of the communication failure is abnormality (for example, shut-off of the breaker 12 or the fuse 13) of the storage battery 10, the output voltage Vo of the storage battery 10 largely decreases compared to the output voltage Vo (voltage that is substantially the same as the estimated output voltage Vp) before occurrence of abnormality.

In contrast, in a case where the estimated output voltage Vp is equal to or less than the output voltage Vo of the storage battery 10, the abnormal site determination unit 40a determines that any of the voltage monitoring circuits 20a to 20d is the abnormal site. This is because in a case where the communication failure is caused due to abnormality of any of the voltage monitoring circuits 20a to 20d, practically, the output voltage Vo of the storage battery 10 does not vary and is retained to substantially the same voltage as the output voltage Vo (voltage that is substantially the same as the estimated output voltage Vp) before occurrence of abnormality.

Here, the abnormal site determination unit 40a calculates the estimated output voltage Vp by using monitoring information having the largest voltage value among monitoring information (voltages Va to Vd) that are obtained from the voltage monitoring circuits 20a to 20d before (immediately before) occurrence of the communication failure. For example, when assuming that the monitoring information (voltage Va) of the battery module 11a which is monitored by the voltage monitoring circuit 20a is the largest, the abnormal site determination unit 40a calculates the estimated output voltage Vp by using the following Expression (1).

$$Vp=(N/n)\cdot\alpha\cdot Va \quad (1)$$

Provided that, "N" in Expression (1) represents a total number of the battery cells C that are provided in the storage battery 10, and "n" represents the number of the battery cells C that constitute the battery module 11a (battery module capable of obtaining the largest voltage Va). In addition, the coefficient α is a variation coefficient that is determined in consideration of a variation in a voltage value of the battery cells C that are provided in the storage battery 10. For example, the coefficient α may be obtained by detecting in advance the maximum value and the minimum value of the voltage in a normal state of each of the battery cells C provided in the storage battery 10 to set a differential voltage ΔV, and by dividing a designed minimum value of the battery cell C by the differential voltage ΔV. That is, the abnormal site determination unit 40a calculates the estimated output voltage Vp by multiplying the voltage Va (the largest voltage) representing the monitoring information of the battery module 11a by a value (N/n), which is obtained by dividing the total number N of the battery cells C provided in the storage battery 10 by the number of battery cells C provided in the battery module 11a, and the variation coefficient (α).

Figure 2:
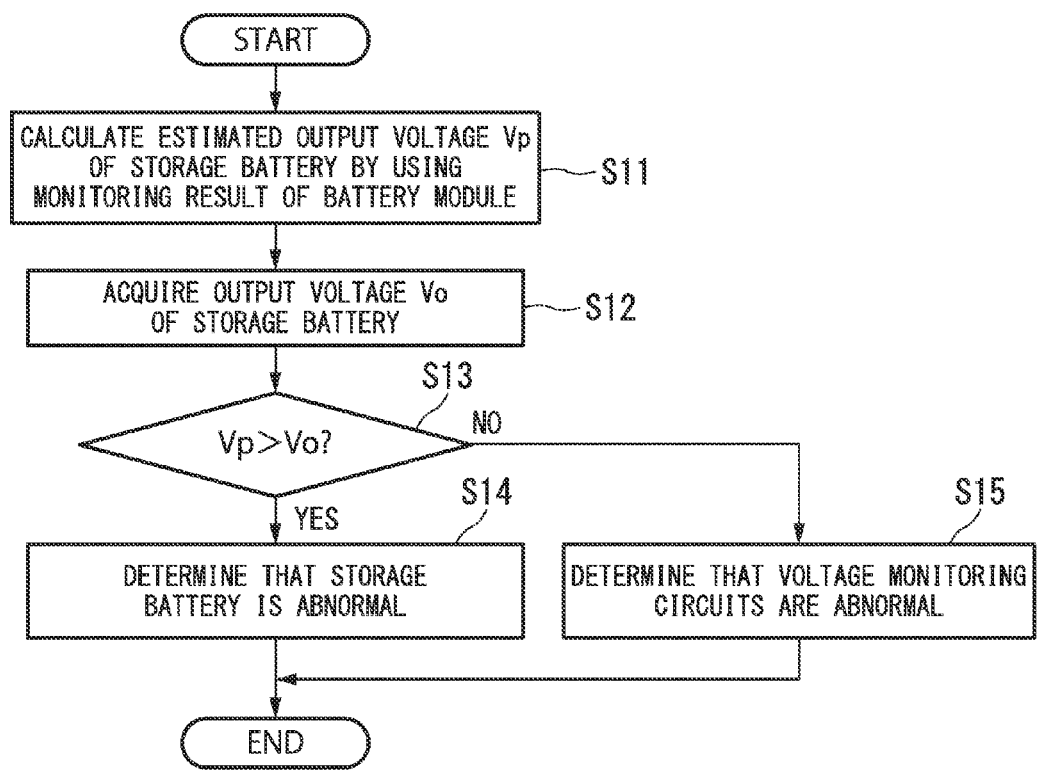
FIG. 2 is a flowchart illustrating an operation of the storage battery system according to the first embodiment of the invention when a communication failure occurs.

Next, an operation of the storage battery system 1 having the above-described configuration will be described. FIG. 2 shows a flowchart illustrating an operation of the storage battery system according to the first embodiment of the invention when the communication failure occurs.

Figure 3:
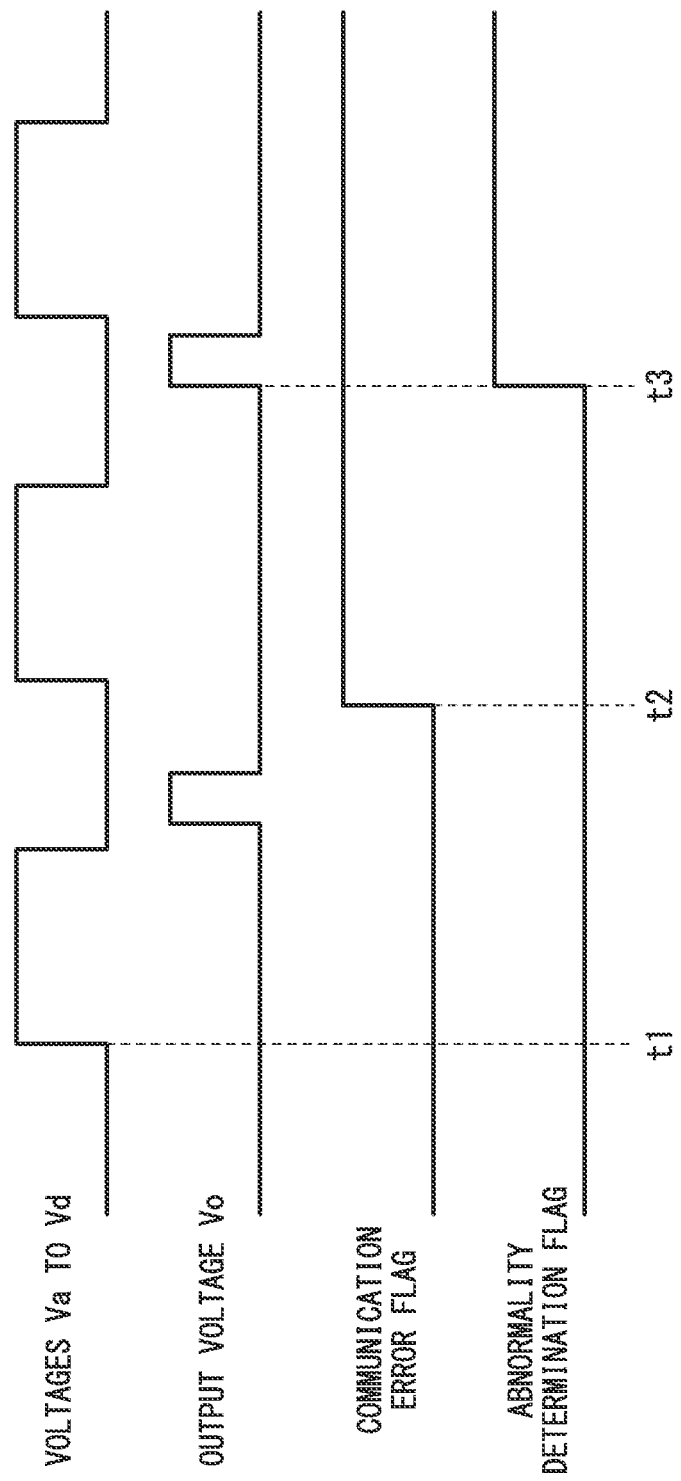
FIG. 3 is a timing chart illustrating the operation of the storage battery system according to the first embodiment of the invention.

In addition, FIG. 3 shows a timing chart illustrating the operation of the storage battery system according to the first embodiment of the invention. Hereinafter, an operation in a case where the communication failure between the voltage monitoring circuits 20a to 20d and the battery control device 40 does not occur will be briefly described, and then the operation in a case where the communication failure occurs will be described.

First, in a case where the communication failure does not occur, communication is regularly carried out between the voltage monitoring circuits 20a to 20d and the battery control device 40, and thus the monitoring information of the voltage monitoring circuits 20a to 20d is regularly acquired by the battery control device 40 (refer to "voltages Va to Vd" in FIG. 3). In addition, separately from the monitoring information of the voltage monitoring circuits 20a to 20d, in the battery control device 40, the output voltage Vo of the storage battery 10 is regularly acquired by the voltage measurement unit (not shown) provided inside the battery control device 40 (refer to "output voltage Vo" in FIG. 3).

When the monitoring information of the voltage monitoring circuits 20a to 20d is acquired, the battery control device 40 obtains the residual capacity of the storage battery 10. In a case where the residual capacity of the storage battery 10 that is obtained is in a permissible range that is specified in advance, the battery control device 40 controls the charging and discharging of the storage battery 10 in accordance with a travelling state of a vehicle. For example, in a case of generating power for allowing a vehicle to travel by driving the motor M, control for discharging electric power stored in the storage battery 10 is carried out. In addition, in a case of decelerating the vehicle, control for charging the storage battery 10 using regenerated electric power supplied from the inverter NV is carried out. In a case where the communication failure does not occur, the above-described operations are repeatedly carried out.

Next, in a case where the communication failure occurs, as shown in FIG. 3, in the battery control device 40, a communication error flag that is a flag indicating occurrence of a communication error varies from an "L (low)" level to an "H (high)" level (time t2). In this case, the abnormal site determination unit 40a provided to the battery control device 40 calculates the estimated output voltage Vp that is estimated as an output voltage of the storage battery 10 using the monitoring information that is obtained from any one of the voltage monitoring circuits 20a to 20d immediately before occurrence of the communication failure (Step S11).

Specifically, the abnormal site determination unit 40a calculates the estimated output voltage Vp using monitoring information having the largest voltage value among the voltages Va to Vd that are obtained at time t1 immediately before the time t2 at which the communication error flag varies from the "L" level to the "H" level. For example, when assuming that monitoring information (voltage Va) of the battery module 11a which is monitored by the voltage monitoring circuit 20a is the largest, the abnormal site determination unit 40a calculates the estimated output voltage Vp using Expression (1).

When the estimated output voltage Vp is calculated, the output voltage Vo of the storage battery 10 is acquired by the voltage measurement unit (not shown) provided inside the battery control device 40 (Step S12: time t3). In addition, when the output voltage Vo is acquired, in the battery control device 40, an abnormality determination flag that is a flag indicating carrying out of abnormality determination varies simultaneously (or substantially simultaneously) from an "L" level to an "H" level. In this case, the abnormal site determination unit 40a determines whether or not the estimated output voltage Vp calculated in Step S11 is more than the output voltage Vo acquired in Step S12 (Step S13).

In a case where it is determined that the estimated output voltage Vp is more than the output voltage Vo (in a case where a determination result in Step S13 is "YES"), the abnormal site determination unit 40a determines that the storage battery 10 is abnormal (Step S14). In a case where it is determined that the estimated output voltage Vp is equal to or less than the output voltage Vo (in a case where a determination result in Step S13 is "NO"), the abnormal site determination unit 40a determines that the voltage monitoring circuits 20a to 20d are abnormal (Step S15). When the communication failure between the voltage monitoring circuits 20a to 20d and the battery control device 40 occurs, the determination of the abnormal site is carried out in this manner.

As described above, in the embodiment, in a case where the communication error flag varies from the "L" level to the "H" level in the battery control device 40, the estimated output voltage Vp of the storage battery 10 is calculated using the monitoring information that is obtained from any one of the voltage monitoring circuits 20a to 20d before variation of the communication error flag, and the estimated output voltage Vp and the output voltage Vo of the storage battery 10 are compared to determine the abnormal site of the communication failure by the abnormal site determination unit 40a. Therefore, in a case where the communication failure occurs, it is possible to easily determine a cause of the failure.

Hereinbefore, the storage battery system according to the first embodiment of the invention has been described, but the invention is not limited to the above-described embodiment and may be modified in the range of the invention without limitation. For example, in the above-described embodiment, for easy comprehension, the storage battery system that is mounted on a vehicle such as an electric vehicle (EV) and a hybrid vehicle (HV) has been described as an example. However, the invention is applicable to storage battery systems that are provided to moving bodies other than the vehicle, such as a two-wheel vehicle and a ship.

Second Embodiment

Hereinafter, a storage battery system according to a second embodiment of the invention will be described in detail with reference to the attached drawings. In the embodiment, the same reference numerals are given to the same components of the above-described embodiment and description thereof will be simplified or omitted.

Figure 4:
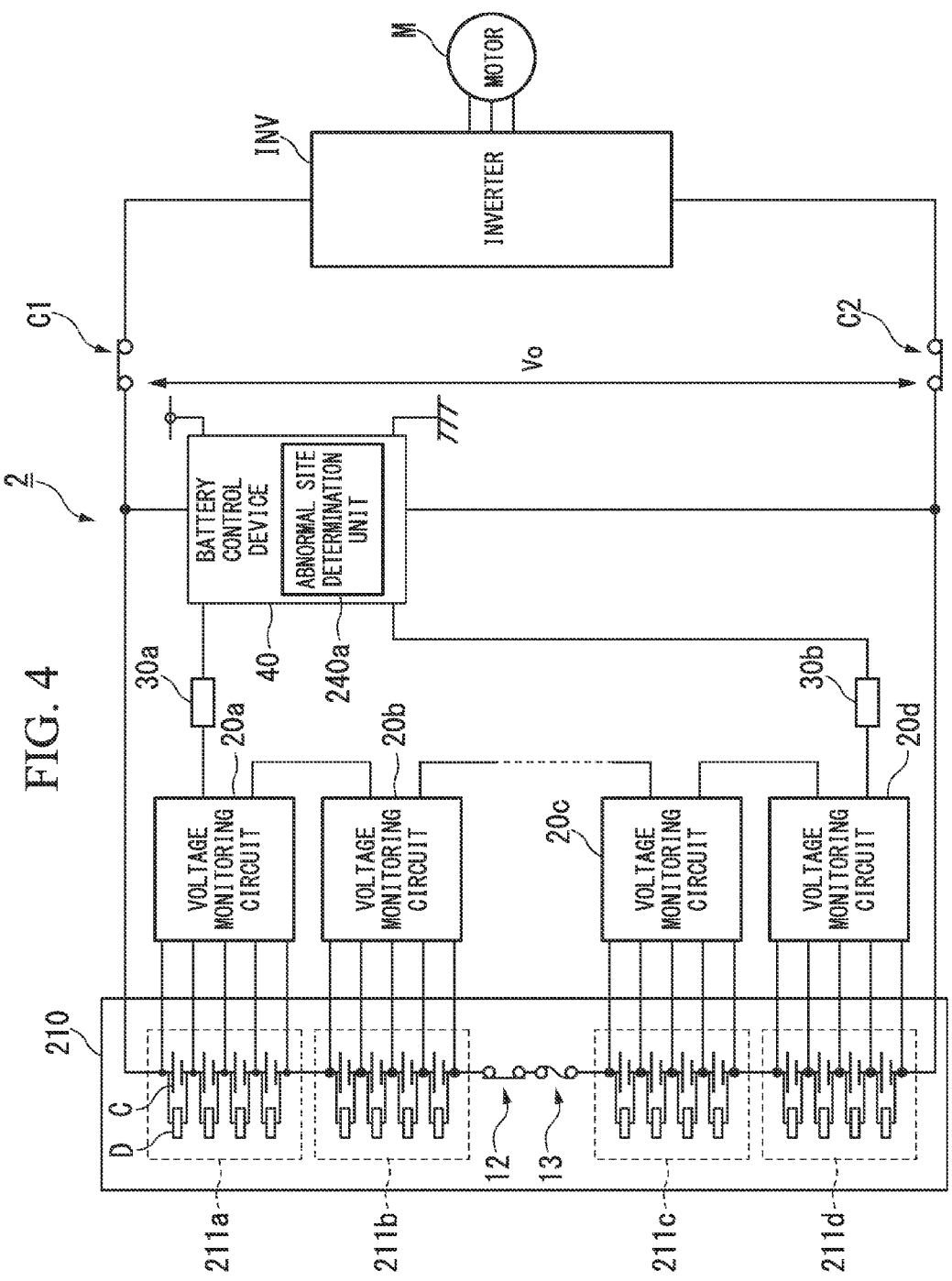
FIG. 4 is a block diagram illustrating a configuration of a main section of a storage battery system according to a second embodiment of the invention.

FIG. 4 shows a block diagram illustrating a configuration of a main section of a storage battery system according to the second embodiment of the invention. As shown in FIG. 4, similar to the storage battery system 1 according to the first embodiment, the storage battery system 2 according to the embodiment includes a storage battery 210, voltage monitoring circuits 20a to 20d, insulating elements 30a and 30b, and a battery control device 40 (control device).

The storage battery system 2 is connected to an inverter INV through contactors C1 and C2. The storage battery system 2 discharges electric power that is stored in the storage battery 210 to supply the electric power to the inverter INV, and charges the storage battery 210 using regenerated electric power supplied from the inverter INV.

The storage battery 210 includes battery modules 211a to 211d that are connected in series, a breaker 12, and a fuse 13. The storage battery 210 carries out discharging of electric power that is stored and charging of electric power that is supplied under control of a battery control device 40. The battery modules 211a to 211d are modules that are configured by connecting a plurality of battery cells C, which are specified in advance, in series. Here, each of the battery cells C is a unit battery that is provided in the battery modules 211a to 211d. For example, the battery cell C is a storage battery (secondary battery) such as a lithium ion battery that is capable of carrying out recharging. An overcurrent shut-off device D that prevents an overcurrent is provided to each of the battery cells C. In addition, in FIG. 4, the storage battery 210 including four battery modules 211a to 211d is shown for brief description. However, the number of battery modules that are provided in the storage battery 210 is arbitrary.

In a case where a communication failure between of the voltage monitoring circuits 20a to 20d occurs, an abnormal site determination unit 240a according to the embodiment calculates the estimated output voltage Vp which is estimated as an output voltage of the storage battery 210 by using any one of monitoring information of the battery cells C which are obtained from the voltage monitoring circuits 20a to 20d before (immediately before) occurrence of the communication failure. In addition, the abnormal site determination unit 240a compares the estimated output voltage Vp that is calculated and an output voltage Vo of the storage battery 210 which is measured by a voltage measurement unit (not shown) provided to the battery control device 40 to determine an abnormal site.

Specifically, in a case where the estimated output voltage Vp is more than the output voltage Vo of the storage battery 210, the abnormal site determination unit 240a determines that the storage battery 210 is an abnormal site. This is because in a case where a cause of the communication failure is abnormality (for example, shut-off of the breaker 12 or the fuse 13, or shut-off of a current path by the overcurrent shut-off device C) of the storage battery 210, the output voltage Vo of the storage battery 210 largely decreases compared to the output voltage Vo (voltage that is substantially the same as the estimated output voltage Vp) before occurrence of abnormality.

In contrast, in a case where the estimated output voltage Vp is equal to or less than the output voltage Vo of the storage battery 210, the abnormal site determination unit 240a determines that any of the voltage monitoring circuits 20a to 20d is the abnormal site. This is because in a case where the communication failure is due to abnormality of any of the voltage monitoring circuits 20a to 20d, the output voltage Vo of the storage battery 210 does not vary, and is retained to substantially the same voltage as the output voltage Vo (voltage that is substantially the same as the estimated output voltage Vp) before occurrence of abnormality.

Here, the abnormal site determination unit 240a calculates the estimated output voltage Vp by using monitoring information having the largest voltage value among monitoring information of the each battery cells C which are obtained from the voltage monitoring circuits 20a to 20d before (immediately before) occurrence of the communication failure. For example, when assuming that a voltage (voltage Vm) of one battery cell C that constitutes the battery module 211a, which is monitored by the voltage monitoring circuit 20a, is the largest, the abnormal site determination unit 240a calculates the estimated output voltage Vp using the following Expression (2).

$$Vp = N \cdot \alpha \cdot Vm \qquad (2)$$

"N" in Expression (2) represents a total number of the battery cells C that are provided in the storage battery 210.

In addition, the coefficient α is a variation coefficient that is determined in consideration of a variation in a voltage value of the battery cells C that are provided in the storage battery 210. For example, the coefficient α may be obtained by detecting in advance the maximum value and the minimum value of the voltage in a normal state of each of the battery cells C provided in the storage battery 210 to set a differential voltage ΔV and by dividing a designed minimum value of the battery cell C by the differential voltage ΔV. That is, the abnormal site determination unit 240a calculates the estimated output voltage Vp by multiplying any one (the largest voltage Vm) of monitoring information of the respective battery cells C which are obtained from the voltage monitoring circuits 20a to 20d by the total number N of the battery cells C provided in the storage battery 210 and the variation coefficient (α).

Figure 5:
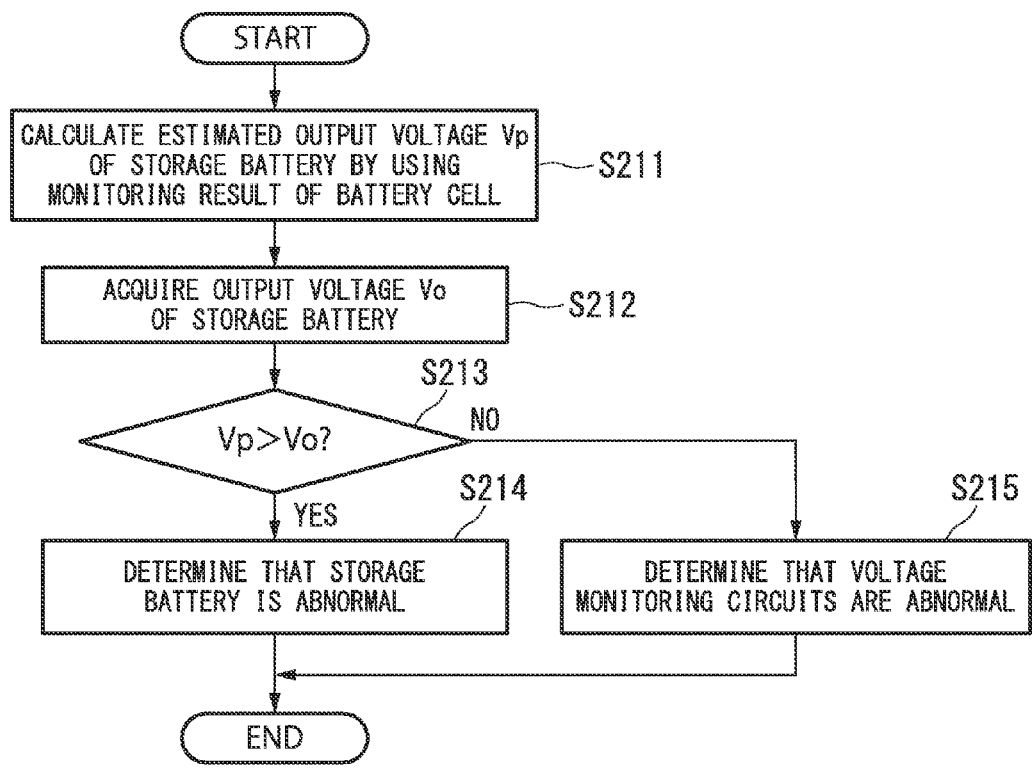
FIG. 5 is a flowchart illustrating an operation of the storage battery system according to the second embodiment of the invention when a communication failure occurs.

Next, an operation of the storage battery system 2 having the above-described configuration will be described. FIG. 5 shows a flowchart illustrating an operation of the storage battery system according to the second embodiment of the invention when the communication failure occurs.

In addition, FIG. 6 shows a timing chart illustrating the operation of the storage battery system according to the second embodiment of the invention. Hereinafter, an operation in a case where the communication failure between the voltage monitoring circuits 20a to 20d and the battery control device 40 does not occur will be briefly described, and then the operation in a case where the communication failure occurs will be described.

First, in a case where the communication failure does not occur, communication is regularly carried out between the voltage monitoring circuits 20a to 20d and the battery control device 40, and thus the monitoring information of the voltage monitoring circuits 20a to 20d is regularly acquired by the battery control device 40 (refer to "voltage Vc" in FIG. 6). In addition, separately from the monitoring information of the voltage monitoring circuits 20a to 20d, in the battery control device 40, the output voltage Vo of the storage battery 210 is regularly acquired by the voltage measurement unit (not shown) provided inside the battery control device 40 (refer to "output voltage Vo" in FIG. 6).

When the monitoring information of the voltage monitoring circuits 20a to 20d is acquired, the battery control device 40 obtains the residual capacity of the storage battery 210. In a case where the residual capacity of the storage battery 210 that is obtained is in a permissible range that is specified in advance, the battery control device 40 controls the charging and discharging of the storage battery 210 in accordance with a travelling state of a vehicle. For example, in a case of generating power for allowing a vehicle to travel by driving the motor M, the control for discharging electric power stored in the storage battery 210 is carried out. In addition, in a case of decelerating the vehicle, control for charging the storage battery 210 using regenerated electric power supplied from the inverter NV is carried out. In a case where the communication failure does not occur, the above-described operations are repeatedly carried out.

Next, in a case where the communication failure occurs, as shown in FIG. 6, in the battery control device 40, a communication error flag that is a flag indicating occurrence of a communication error varies from an "L (low)" level to an "H (high)" level (time t2). In this case, the abnormal site determination unit 240a provided at the battery control device 40 calculates the estimated output voltage Vp that is estimated as an output voltage of the storage battery 210 using any one of monitoring information of the respective battery cells C which are obtained from the respective voltage monitoring circuits 20a to 20d immediately before occurrence of the communication failure (Step S211).

Specifically, the abnormal site determination unit 240a calculates the estimated output voltage Vp using a voltage value having the largest voltage value among the voltages (voltages Vc) of the respective battery cells C which are obtained at time t1 immediately before the time t2 at which the communication error flag varies from the "L" level to the "H" level. For example, when assuming that a voltage (voltage Vm) of one battery cell C that constitutes the battery module 211a monitored by the voltage monitoring circuit 20a is the largest, the abnormal site determination unit 240a calculates the estimated output voltage Vp using Expression (2).

When the estimated output voltage Vp is calculated, the output voltage Vo of the storage battery 210 is acquired by the voltage measurement unit (not shown) provided inside the battery control device 40 (Step S212: time t3). In addition, when the output voltage Vo is acquired, in the battery control device 40, an abnormality determination flag that is a flag indicating carrying out of abnormality determination varies simultaneously (or substantially simultaneously) from an "L" level to an "H" level. In this case, the abnormal site determination unit 240a determines whether or not the estimated output voltage Vp calculated in Step S211 is more than the output voltage Vo acquired in Step S212 (Step S213).

In a case where it is determined that the estimated output voltage Vp is more than the output voltage Vo (in a case where a determination result in Step S213 is "YES"), the abnormal site determination unit 240a determines that the storage battery 210 is abnormal (Step S214). In a case where it is determined that the estimated output voltage Vp is equal to or less than the output voltage Vo (in a case where a determination result in Step S213 is "NO"), the abnormal site determination unit 240a determines that the voltage monitoring circuits 20a to 20d are abnormal (Step S215). When the communication failure between the voltage monitoring circuits 20a to 20d and the battery control device 40 occurs, the determination of the abnormal site is carried out in this manner.

As described above, in the embodiment, in a case where the communication error flag varies from the "L" level to the "H" level in the battery control device 40, the estimated output voltage Vp of the storage battery 210 is calculated using any one of monitoring information of the respective battery cells C which are obtained from the voltage monitoring circuits 20a to 20d before variation of the communication error flag, and the estimated output voltage Vp and the output voltage Vo of the storage battery 210 are compared to determine the abnormal site of the communication failure by the abnormal site determination unit 240a. Therefore, in a case where the communication failure occurs, it is possible to easily determine a cause of the failure.

Hereinbefore, the storage battery system according to the second embodiment of the invention has been described, but the invention is not limited to the above-described embodiment and may be modified without limitation in the range of the invention. For example, in the above-described embodiment, for easy comprehension, the storage battery system that is mounted on a vehicle such as an electric vehicle (EV) and a hybrid vehicle (HV) has been described as an example. However, the invention is applicable to storage battery systems that are provided to moving bodies other than the vehicle, such as a two-wheel vehicle and a ship.

In addition, the technologies of the above-described first and second embodiments may be appropriately combined. In addition, some components may be omitted.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A storage battery system comprising:
a storage battery comprising a plurality of battery modules, each of the plurality of battery modules being configured by connecting battery cells in series;
a plurality of voltage monitoring circuits for monitoring a voltage of the battery module, each of the plurality of voltage monitoring circuits being provided in accordance with each of the battery modules; and
a control device that is connected to the voltage monitoring circuits in a circular shape and controls charging and discharging of the storage battery on the basis of the voltage of the battery module that is obtained by carrying out communication with the voltage monitoring circuits,
wherein the control device comprises a determination unit that calculates an estimated output voltage of the storage battery by using the voltage of the battery module that is obtained from any one of the voltage monitoring circuits before occurrence of a communication failure in a case where the communication failure with any one of the voltage monitoring circuits occurs, and compares the estimated output voltage and an output voltage of the storage battery after occurrence of the communication failure to determine an abnormal site of the communication failure, and wherein the determination unit calculates the estimated output voltage by multiplying the voltage of the battery module obtained from any one of the voltage monitoring circuits by a value obtained by dividing a total number of the battery cells provided in the storage battery by a number of the battery cells provided in the battery module.

2. The storage battery system according to claim 1,
wherein in a case where the estimated output voltage is more than the output voltage of the storage battery after occurrence of the communication failure, the determination unit determines that the storage battery is the abnormal site.

3. The storage battery system according to claim 1,
wherein in a case where the estimated output voltage is equal to or less than the output voltage of the storage battery after occurrence of the communication failure, the determination unit determines that the voltage monitoring circuit is the abnormal site.

4. The storage battery system according to claim 1,
wherein the voltage of the battery module that is used for calculation of the estimated output voltage is the voltage of the battery module having the largest voltage value among the voltage of the battery module obtained from the voltage monitoring circuits before occurrence of the communication failure.

5. A storage battery system comprising:
a storage battery comprising a plurality of battery modules, each of the plurality of battery modules being configured by connecting battery cells in series;
a plurality of voltage monitoring circuits for individually monitoring a voltage of the battery cells that constitute the battery module, each of the plurality of voltage monitoring circuits being provided in accordance with each of the battery modules; and
a control device that is connected to the voltage monitoring circuits in a circular shape, and controls charging and discharging of the storage battery on the basis of the voltage of the battery cells that is obtained by carrying out communication with the voltage monitoring circuits, wherein the control device comprises a determination unit that calculates an estimated output voltage of the storage battery by using any one of the voltage of the battery cells which are obtained from the voltage monitoring circuits before occurrence of a communication failure in a case where the communication failure with any one of the voltage monitoring circuits occurs, and compares the estimated output voltage and an output voltage of the storage battery after occurrence of the communication failure to determine an abnormal site of the communication failure, wherein the determination unit calculates the estimated output voltage by multiplying any one of the voltage of the battery cells which are obtained from the voltage monitoring circuits by a total number of the battery cells that are provided in the storage battery.

6. The storage battery system according to claim 5,
wherein in a case where the estimated output voltage is more than the output voltage of the storage battery after occurrence of the communication failure, the determination unit determines that the storage battery is the abnormal site.

7. The storage battery system according to claim 5,
wherein in a case where the estimated output voltage is equal to or less than the output voltage of the storage battery after occurrence of the communication failure, the determination unit determines that the voltage monitoring circuit is the abnormal site.

8. The storage battery system according to claim 5,
wherein the storage battery comprises a plurality of overcurrent shut-off devices, each being provided to each of the battery cells.

9. The storage battery system according to claim 5,
voltage of the battery cells that is used for calculation of the estimated output voltage is the voltage of the battery cells having the largest voltage value among the voltage of the battery cells which are obtained from the voltage monitoring circuits before occurrence of the communication failure.

* * * * *